United States Patent [19]

Akiyama

[11] 4,012,833
[45] Mar. 22, 1977

[54] METHOD OF MAKING DISPLAY STRUCTURE HAVING LIGHT EMITTING DIODES

[75] Inventor: Katsuhiko Akiyama, Atsugi, Japan

[73] Assignee: Sony Corporation, Tokyo, Japan

[22] Filed: Nov. 7, 1975

[21] Appl. No.: 629,756

Related U.S. Application Data

[62] Division of Ser. No. 535,173, Dec. 23, 1974, Pat. No. 3,936,694.

[30] Foreign Application Priority Data

Dec. 28, 1973 Japan .................................. 48-3360
Nov. 21, 1974 Japan ............................. 49-134643

[52] U.S. Cl. .................................. 29/591; 29/589; 29/626; 357/30
[51] Int. Cl.² .......................................... B01J 17/00
[58] Field of Search ................ 29/576 S, 589, 590, 29/591, 588, 626; 317/101 C, 101 CP; 357/30

[56] References Cited

UNITED STATES PATENTS 3,049,647 8/1962 Lincoln .............................. 317/101
3,098,951 7/1963 Ayer ..................................... 29/589

*Primary Examiner*—W. Tupman

*Attorney, Agent, or Firm*—Hill, Gross, Simpson, Van Santen, Steadman, Chiara & Simpson

[57] ABSTRACT

A method is disclosed for making a light emitting diode having positive and negative electrodes which includes forming a first conductive metal layer on a substrate of insulating material, a second conductive layer of a metal different from the first is then formed on the exposed surface of the first layer. The two layers are then etched to form aligned narrow openings and thereafter the first layer is overetched in its opening with the second opening being used as a mask to form a relatively large opening aligned with the narrow opening of the second layer. This leaves the first opening with a pair of eaves overhanging the relatively large opening of the first opening. The dimensions of the large opening are wider than the spacing between the positive and negative electrodes of the light emitting diode. A light emitting diode is then inserted in said aligned openings with its pn junction perpendicular to said substrate, the dimensions of the small opening being such that the eaves are bent down into electrical contact with the positive and negative electrodes of the diode.

10 Claims, 17 Drawing Figures

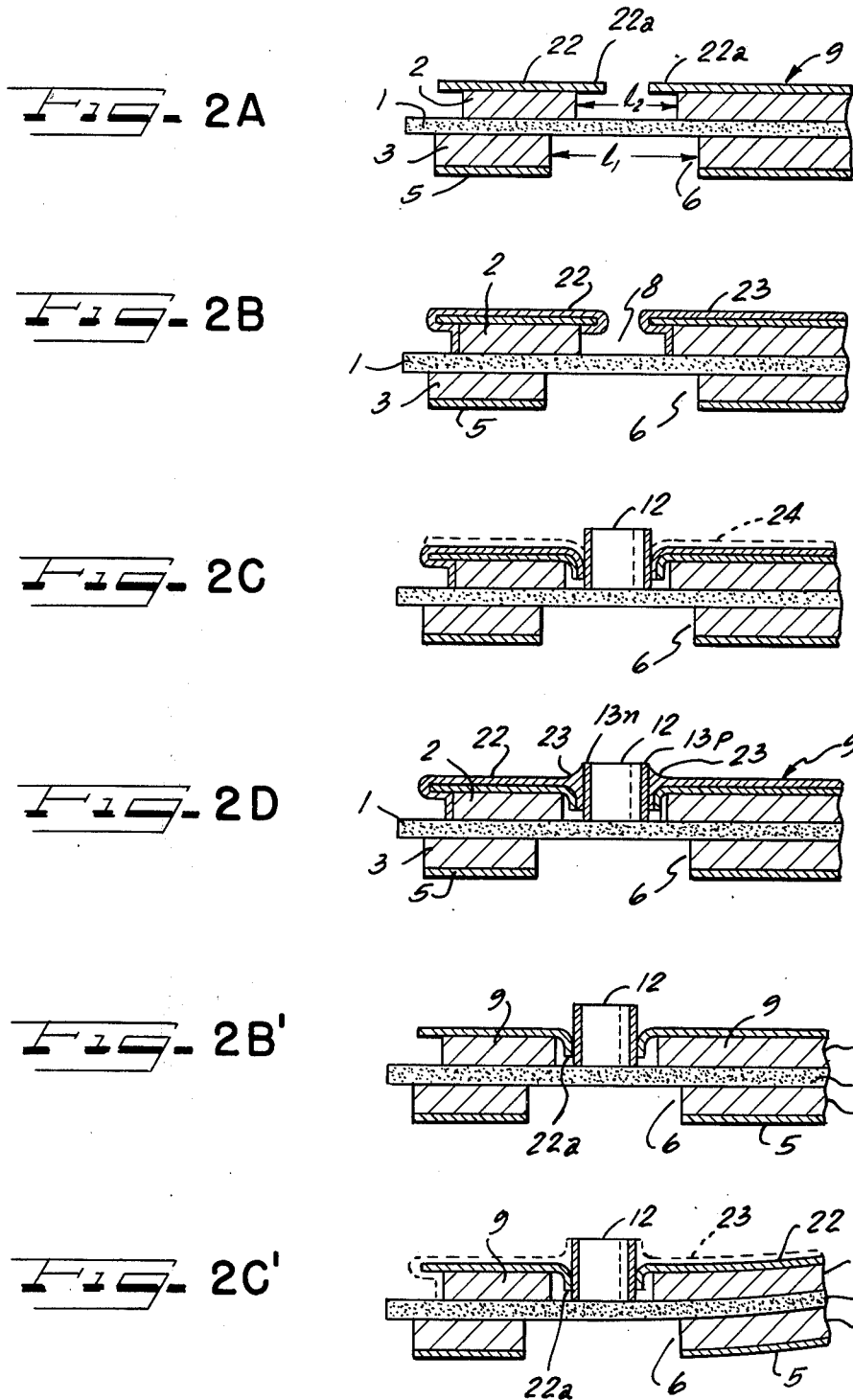

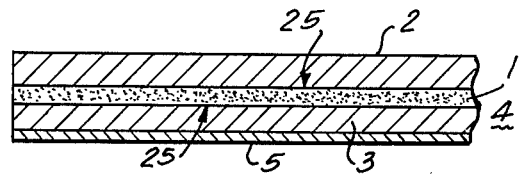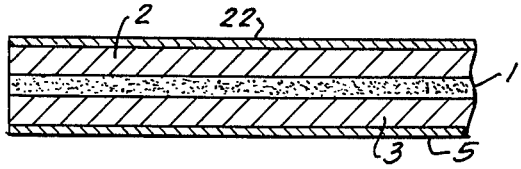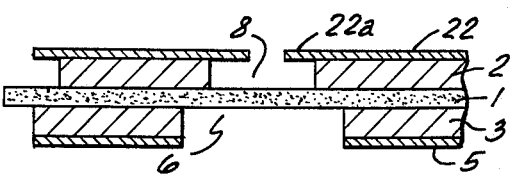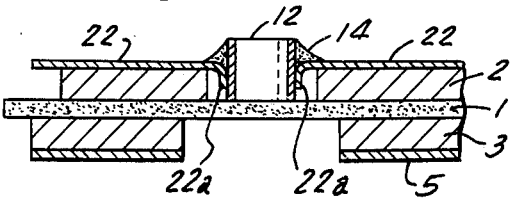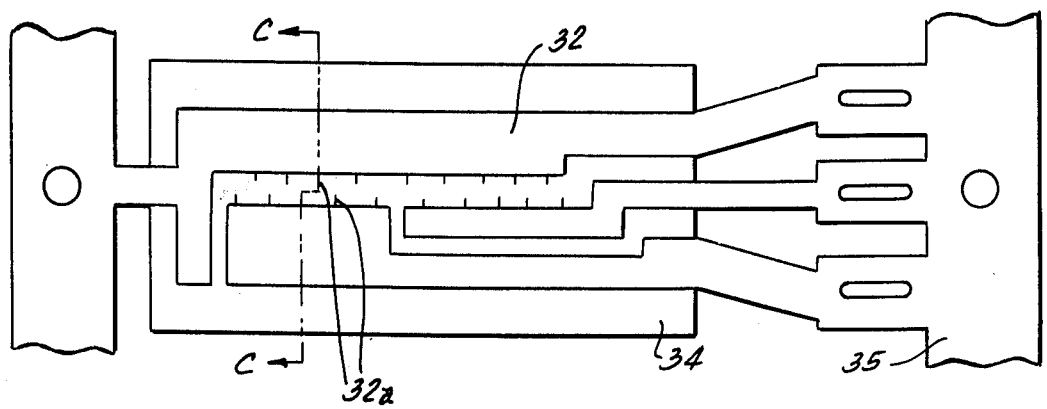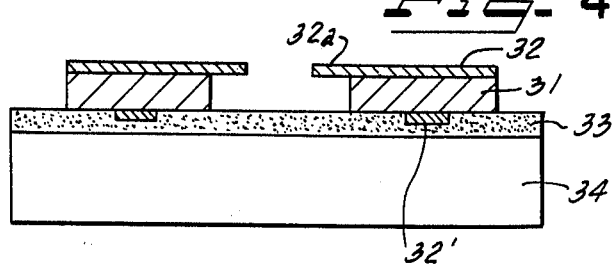

METHOD OF MAKING DISPLAY STRUCTURE HAVING LIGHT EMITTING DIODES

This application is a division of my copending application for "DISPLAY STRUCTURE HAVING LIGHT EMITTING DIODES," Ser. No. 535,173, filed Dec. 23, 1974, now U.S. Pat. No. 3,936,694 and assigned to the same assignee as the present invention.

FIELD OF THE INVENTION

This invention relates to a novel method of making a display device of the type having a light emitting semiconductor diode in which the diode is securely supported by a simple structure.

SUMMARY OF THE INVENTION

It is an object of the present invention to provide a novel method for making a display device in which a semiconductor element is securely supported by supporting members for solid connection to conductive members with a simple construction.

Another object of this invention is to provide a novel method of making a display device having a light emitting diode with positive and negative electrodes and in which the diode has its electrodes easily and positively soldered to conductive members.

A further object of the present invention is to provide a novel method for making a display device which has an effective enlargement when being observed.

Yet another object of this invention is to provide a novel method of making a display device which is easy to manufacture and low in cost.

Additional and other objects, features and advantages of this invention will be apparent from the following description, taken in conjunction with the accompanying drawings.

BRIEF DESCRIPTION OF THE DRAWINGS

FIGS. 2A to 2D are diagrammatic cross-sectional views illustrating one embodiment of the manufacturing process of the present invention;

FIGS. 3A to 3D are diagrammatic sectional views illustrating a different embodiment of the present invention;

FIG. 4A is a diagrammatic plan view of still another type of display device which is manufactured in accordance with a further embodiment of the present invention; and FIG. 4B is a cross-sectional view taken along the line C—C of FIG. 4A.

DESCRIPTION OF THE PREFERRED EMBODIMENTS

Figure 1A:
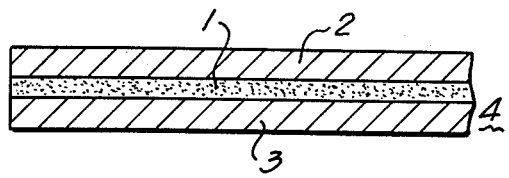
FIGS. 1A, 1B and 1C are diagrammatic sectional views of initial steps in one embodiment of the present invention.

In this invention, a light-transparent insulating sheet 1 is attached at its opposite surfaces with metal layers or copper plates 2 and 3 by adhesive agent to form a substrate 4 as shown in FIG. 1A. In this case, as the sheet 1, it is preferred to use a relatively thin film such as a light-transparent resin film consisting of polyimide resin, polyester resin or the like and having a thickness of about $50\mu$ (micron). In addition, the copper plates 2 and 3 are preferred to have a thickness of about $70\mu$ each.

Next, the surface of the copper plate 3 formed on one surface of the sheet 1 is subjected to a blackening process. The blackening process is effected by applying a so-called black-nickel plating 5 consisting of alloy plating of zinc, sulphur and nickel. In this case, the thickness of the black-nickel plating 5 is made about $1\mu$ maximum, by way of example (see FIG. 1B).

Figure 1B:
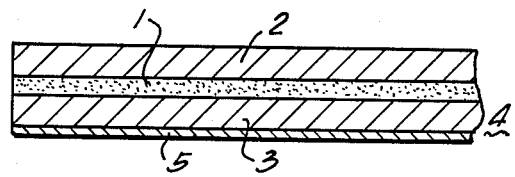
Figure 1C:
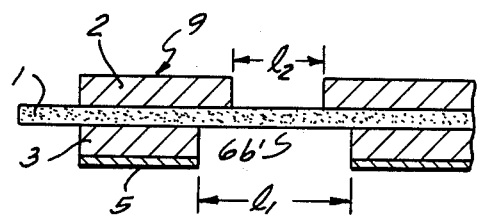

After the copper plate 3 is applied with a black nickel plating 5, portions of the copper plate 2 and the copper plate 3 are removed by etching in a manner hereafter to be described (see FIG. 1C). The sandwich composed of the copper layer 2, the light transparent insulating sheet 1, and the nickel plating layer 5 comprises an initial construction for commencing the method of manufacture which forms one preferred embodiment of the present invention. After the sandwich shown in FIG. 1B is formed, the copper layer 2 is etched to provide an opening having a width $l_2$ and the copper layer 3 and nickel layer 5 are etched to provide an opening having a larger width $l_1$.

Figure 1D:
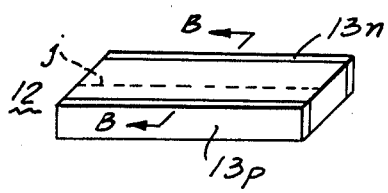
FIGS. 1D and 1D' are diagrammatic views of a pn junction diode which is to be mounted by the novel method of the present invention.
Figure 1D:
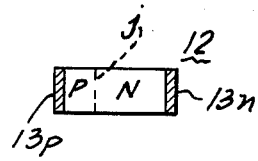

The light emitting semiconductor element 12 which is to be mounted in accordance with the method of the present invention is a pn junction type semiconductor device as depicted in FIGS. 1D and 1D'. FIG. 1D' is a cross sectional view of the diode 12 taken along the line B—B of FIG. 1D. Electrodes 13p and 13n are connected by deposition to the end surfaces of the diodes of the p-type and n-type regions in ohmic contact therewith to form a light emitting diode.

Referring now to FIGS. 2A to 2D, the element 12 is positively secured to the substrate 4 (which is the sandwich formed by layers 1, 2 and 3) in the manner now to be described. In advance of the etching process, which forms the opening in the copper layer 2 and the opening in the copper layer 3, a nickel layer 22 is plated on the copper plate 2 to be disposed with the elements 12. Thereafter, in the case of etching the copper plate 2, firstly the nickel layer 22 and the copper plate 2 are etched with narrow etching width, and then the copper plate 2 is over-etched in a predetermined width with the nickel layer 22 being used as a mask. During the etching the conductive layer 22 is etched in such a way that the portion thereof on one side of the opening 8 is separate and distinct from the portion on the other side of the opening 8. These two portions thus provide two electrically separated conductive paths for appropriate connection in a circuit. In other words, as depicted in FIG. 2A, eaves 22a of the nickel layer 22 are formed by the above over-etching process, at least, at a portion over the groove 8 wherein the element 12 is disposed. In the above etching process, the final etching width $l_2$ of the copper plate 2 obtained by the over-etching is selected in a predetermined size which has been described with reference to FIG. 1.

After the eaves 22a of the nickel layer 22 are thus formed, a tin plating layer 23, by way of example, is formed by deposition on the surface including the nickel layer 22 and a copper plate 2 as shown in FIG. 2B. Next, the element 12 is inserted into each groove 8 having the eaves 22a thereon by pressing down the respective eaves 22a. In this case, the element 12 is resiliently supported by the eaves 22a as shown in FIG. 2C. Besides, the electrodes 13p and 13n of the element 12 are electrically brought into contact with the copper plates 2 through the tin plating layers 23 and the nickel layer 22. After flux 24 is applied on the tin plating layers 23 with the above described condition as shown in FIG. 2C, an alloy process is applied thereto. Thus, the tin plating layers 23 are subjected to an alloy process as shown in FIG. 2D to connect the electrodes 13p and 13n of the element 12 to the copper plates 2 or wiring portions 9 in an electrical and mechanical manner.

Meanwhile, with a condition where the eaves 22a are formed, the element 12 is inserted into the groove 8 by pushing down the eaves 22a directly and the element is then supported resiliently by the curved portions of the eaves 22a of the nickel layers as shown in FIG. 2B', and thus the electrical and mechanical connections between the element 12 and conductive portions 9 are completed. Also, as shown in FIG. 2C', a tin plating layer 23 is further deposited on the nickel layer 22, and then an alloy process may be used to obtain a construction as shown in FIG. 2D.

When the eaves 22a are provided at the end edges of the wiring portions 9 facing the groove 8 and the eaves 22a are pushed down to insert the element 12, the element 12 is securely supported by the eaves 22a in a mechanical manner. Accordingly, the operation in the following process can be smoothly carried out, that is, the element can be prevented from being shaken and falling out in its transportation and precise coupling with no positional shift can occur.

FIGS. 3A to 3D show another improved method of this invention, in which the light emitting display is made to look larger, particularly even with small light emitting semiconductor elements. That is, a so-called effect of enlargement is achieved. In other words, there is first provided a sheet 1 which is previously applied with aventurine lacquer 25 on its opposite surfaces and then the copper plates 2 and 3 are formed by deposition on both the surfaces of this sheet 1 to form the substrate 4 as shown in FIG. 3A. Further, the surface of one copper plate 3 is subjected to the black-nickel plating 5 as occasion demands. Thereafter, in the case where the eaves are to be provided similar to the case of FIGS. 2A to 2D, the nickel layer 22 is deposited on the surface of the copper plate 2 (see FIG. 3B) and then the copper plates 2 and 3 together with the nickel layer 22 are subjected to etching process to form the eaves 22a on the nickel layer 22, thus a predetermined pattern is formed as shown in FIG. 3C. In this case, the aventurine lacquer 25 comes out to the outside at etched portions. Further, the recess 6 formed in the copper plate 3 is made larger than the groove 8 of the copper plate 2.

Next, the element 12 is inserted into the groove 8 of the copper plate 2 and they are connected by the solder paste 14 as shown in FIG. 3D.

With such a construction, the light emitted from the element 12 is observed through the transparent sheet 1 from the side of copper plate 3. In this case, since the surface of the sheet 1 is applied with the aventurine lacquer 25, the light is reflected diffusively to perform a display with a moderate by bold figure.

FIGS. 4A and 4B show a further embodiment of this invention. At first, an iron plate 31 with a thickness of about 250μ is applied with a copper plating having a thickness of about 20μ at its opposite surfaces with a photo resist being used as a mask to form a copper layer 32 and copper marks 32' in predetermined patterns. In this case, a gap between the copper layers 32 on the upper side is made substantially 0.6 mm and both the layers 32 have projected therefrom comb-like electrodes each being substantially 0.5 mm in pitch, 100μ in width and 225μ in length.

Next, a black ceramic substrate 34 having a thickness of about 8 mm is secured to the lower surface of the iron plate 31 through epoxy resin 33 or the like with the copper marks 32' formed on the bottom surface being used as its guide.

Thereafter, the iron plate 31 is etched in a lead-frame shape 35 with the copper layer 32 being used as a mask as shown in FIG. 4A. In this case, the iron plate 31 is over-etched by 100 to 150μ to form eaves 32a of the copper layer 32. Then, a solder plating with thickness of about 20μ is applied on the surface including the copper layer or electrodes 32 and the iron plate 31. Next, a GaP light emitting semiconductor element, which is substantially 4 mm long, 0.5 mm wide and 180μ high, is inserted between the eaves 32a of the copper layer 32 with the PN-junction of the element being perpendicular to the substrate 34 and finally subjected to a soldering process.

In the embodiment of the invention shown in FIGS. 4A and 4B, the diode is viewed from the side of the structure opposite to that where the opaque black ceramic layer lies, i.e., from above as seen in FIG. 4B.

It will be apparent to those skilled in the art that many modifications and variations may be effected without departing from the spirit and scope of the novel concepts of the present invention.

I claim:

1. A method of making a light emitting diode display device having positive and negative electrodes comprising the steps of:
   a. forming a first conductive metal layer on one surface of a substrate of insulating material;
   b. forming a second conductive metal layer covering the other surface of said substrate;
   c. forming a thin metal conductive layer on the surface of said second metal layer;
   d. etching an opening through each of said metal layers, the openings being aligned with respect to each other;
   e. the width of the opening in said second metal layer being narrower than the width of the opening in said first metal layer and the width of the opening in said thin metal layer being narrower than the width of the opening in said second metal layer;
   f. the over hanging portions of said thin metal layer providing eaves extending partly over said second opening;
   g. mounting the light emitting diode in said pair of aligned openings with its pn junction perpendicular to said substrate so as to bend down said eaves into said second opening; and
   h. soldering said positive and negative electrodes with said eaves, respectively.

2. A method of making a display device according to claim 1, in which said first metal layer has a plurality of eaves corresponding to and overhanging said first opening.

3. A method of making a display device according to claim 1, in which said eaves mechanically grip said light emitting diode before soldering.

4. The method of assembling in a display structure a light emitting diode, said diode having a pn junction and electrodes therefor on opposite side thereof, which includes forming a substrate of a transparent insulating material forming a first conductive metal layer on one surface of said substrate, etching through said first metal layer to form a first opening, forming a second metal layer on said first layer of a different metal from said first layer, etching through said second layer to form a second opening aligned with and smaller in size than said first opening to leave a pair of confronting overhanging eaves, said etching of said second layer also including the etching away of other portions of said second layer to form two electrically separate conducting paths which terminate in the overhanging eaves, and inserting a light emitting diode into said opening with the plane of said pn junction perpendicular to said substrate, the spacing of the confronting eaves of said second layer being such that the confronting eaves are bent downwardly as the diode is inserted with said eaves in firm mechanical and electrical contact with said electrodes.

5. The method according to claim 4, in which said electrodes are bonded to said bent down eaves.

6. The method according to claim 4, in which said electrodes are soldered to said bent down eaves, 7. The method according to claim 4, in which a third conductive metal layer of the same material as said first layer is formed on the opposite surface of said substrate, and etching through said third layer to form a third opening aligned with said first and second openings, said third opening being larger in width than said first opening.

8. The method according to claim 7, in which the etching of said third opening takes place at the same time as that of said first layer.

9. The method according to claim 8, in which the first and third layers are copper and the second layer is nickel, and in which after the overhanging eaves are formed, a fourth layer of tin plating is formed on said nickel layer.

10. The method according to claim 9, in which the tin plating of the overhanging eaves is alloyed to said first layer.

* * * * *